US010305160B2

(12) United States Patent
Outaleb et al.

(10) Patent No.: US 10,305,160 B2
(45) Date of Patent: May 28, 2019

(54) DUAL-BAND RADIO FREQUENCY DEVICES INCORPORATING METAMATERIAL TYPE STRUCTURES AND RELATED METHODS

(71) Applicant: Alcatel-Lucent Canada, Inc., Ottawa (CA)

(72) Inventors: Noureddine Outaleb, Ottawa (CA); Babak Alavikia, Ottawa (CA); Larbi Talbi, Ottawa (CA)

(*) Notice: Subject to any disclaimer, the term of this patent is extended or adjusted under 35 U.S.C. 154(b) by 45 days.

(21) Appl. No.: 15/386,029

(22) Filed: Dec. 21, 2016

(65) Prior Publication Data

US 2018/0174735 A1    Jun. 21, 2018

(51) Int. Cl.
| | |
|---|---|
| *H01F 27/28* | (2006.01) |
| *H01P 11/00* | (2006.01) |
| *H01P 7/08* | (2006.01) |
| *H01P 5/12* | (2006.01) |
| *H01P 5/02* | (2006.01) |
| *H03F 1/02* | (2006.01) |
| *H03F 1/56* | (2006.01) |
| *H03F 3/195* | (2006.01) |
| *H03F 3/24* | (2006.01) |
| *H03F 3/60* | (2006.01) |
| *H01F 17/00* | (2006.01) |

(52) U.S. Cl.
CPC ........ *H01P 11/001* (2013.01); *H01F 17/0006* (2013.01); *H01P 5/028* (2013.01); *H01P 5/12* (2013.01); *H01P 7/082* (2013.01); *H03F 1/0288* (2013.01); *H03F 1/56* (2013.01); *H03F 3/195* (2013.01); *H03F 3/245* (2013.01); *H03F 3/602* (2013.01); *H03F 2200/255* (2013.01); *H03F 2200/451* (2013.01); *H03F 2200/543* (2013.01)

(58) Field of Classification Search
CPC .................................................. H01F 27/2804
See application file for complete search history.

(56) References Cited

PUBLICATIONS

Safia, Ousama Abu et al., "A New Type of Transmission Line-Based Metamaterial Resonator and Its Implementation in Original Applications", IEEE Transactions on Magnetics, vol. 49, No. 3, Mar. 2013, pp. 968-973.

*Primary Examiner* — Patricia T Nguyen
(74) *Attorney, Agent, or Firm* — Capitol Patent & Trademark Law Firm, PLLC

(57) ABSTRACT

Radio-frequency devices that include metamaterial structures are provided. Inclusion of resonator sections in a structure enables the utilization of desirable line segment widths without sacrificing performance, and further enables a reduction in the amount of space or area taken up by such devices on a printed circuit board.

27 Claims, 10 Drawing Sheets

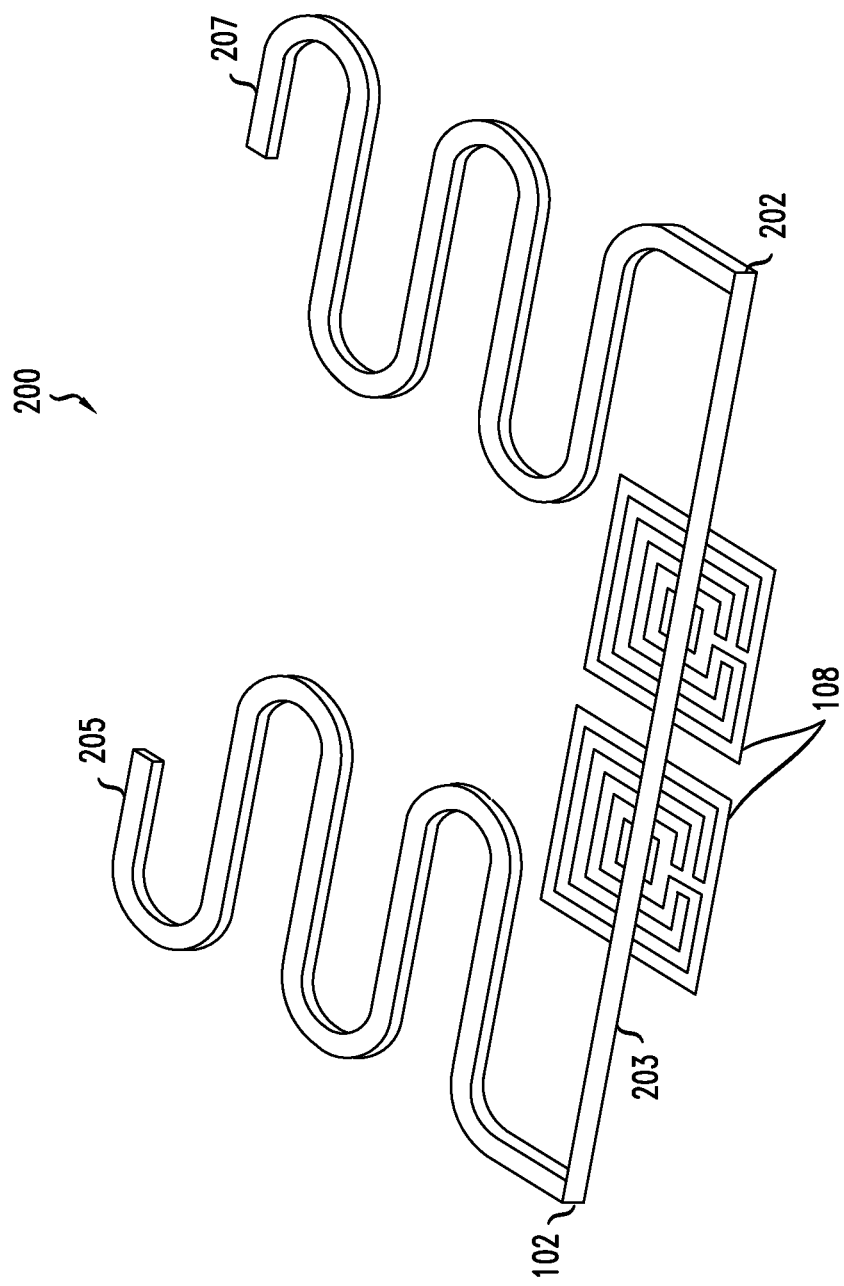

DUAL-BAND RADIO FREQUENCY DEVICES INCORPORATING METAMATERIAL TYPE STRUCTURES AND RELATED METHODS

TECHNICAL FIELD

The present disclosure relates generally to the field of radio-frequency (RF) devices, and, more particularly, but not exclusively, to methods and apparatuses useful for manipulating impedance in RF circuits.

INTRODUCTION

This section introduces aspects that may be helpful to facilitate a better understanding of the described invention(s). Accordingly, the statements in this section are to be read in this light and are not to be understood as admissions about what is, or what is not, in the prior art.

Dual-band radio frequency (RF) circuits are needed in many telecommunications applications. For example, dual-band impedance transformers are used in existing dual-band transceivers that simultaneously transmit RF signals over two different RF frequency ranges (e.g., bands). Existing transceivers comprise microstrip line segments. However, desired transmission line segment widths for the microstrip line segments are not feasible or cannot be economically fabricated using existing printed circuit board (PCB) processes because typical manufacturing tolerances are smaller than easily obtained by routine processing. While wider line segment widths could be used, there are disadvantages that make such line segment widths undesirable for small electronic devices.

Accordingly, it is desirable to provide dual-band RF structures (e.g., devices) that use desired line segment widths without sacrificing performance. It is further desirable to provide dual-band RF devices that use desired line segment widths that also reduce the amount of space or area taken up by such devices on a PCB.

SUMMARY

The inventor discloses various apparatuses and methods that may be beneficially applied in RF circuits to manipulate impedance of circuit paths, for example. While such embodiments may be expected to improve performance, reduce cost and/or reduce circuit size relative to conventional approaches, no particular result is a requirement of the described and claimed invention(s) unless explicitly recited in a particular claim set forth in the numbered paragraphs at the end of this description.

The inventor has recognized that problems with existing dual-band RF devices can be overcome by using a metamaterial-type structure that includes transmission line segments and a plurality of resonator sections that are arranged to perturb, effect, disturb or alter (collectively "perturb") the electrical transmission characteristics of the transmission line segments, thereby affecting their permittivity and permeability. More specifically, placing one or more resonator sections in proximity to a transmission line segment affects the characteristic impedance of the line segment as well as the effective constituent parameters of a dielectric substrate that is also a part of the structure. This effects the propagation modes of signals (e.g., communication signals) being transmitted via the line segment due to capacitive or inductive coupling between the resonator sections and the line segment, and an energy exchange between the two.

In more detail, one embodiment is directed at a radio-frequency RF structure, comprising a dielectric substrate, an impedance transformer formed on one side of said dielectric substrate and comprising a plurality of transmission line segments including at least one transmission line segment configured as a stub segment, and a plurality of resonator sections formed on an opposite side of said dielectric substrate, each resonator section being located proximate to a corresponding one of said transmission line segments, including said stub segment. In an embodiment, one or more of the transmission line segments may comprise a dual-band branch-line coupler.

The stub segment may comprise a microstrip line circuit. When so configured, the resonator sections are configured as complementary resonator sections. Alternatively, the stub segment may comprise a slotline circuit. When so configured the resonator sections are configured as normal resonator sections.

Further, the impedance transformer may comprise either a Pi-shaped impedance transformer or a T-shaped impedance transformer. In one embodiment, the Pi-shaped transformer may comprise serpentine line stub segments connected to a transmission line segment.

More particularly, impedance-transformers provided by various embodiments may be configured to operate as a dual-band transformer having an upper operating center frequency and a lower operating center frequency, and each of resonator section used in the transformer may be configured to resonate at a resonant frequency greater than said upper operating center frequency.

Turning now to the resonator sections, in one embodiment each resonator section may comprise a distributed inductor stub portion and a distributed capacitor stub portion, wherein the distributed inductor stub portion and distributed capacitor stub portion may be oriented about parallel to a corresponding transmission line segment.

In addition to the embodiments described above (and herein), some embodiments also provide for inventive dual-band Doherty amplifiers. In one embodiment such an amplifier may comprise dual-branch line coupler that comprises a first plurality of resonator sections, where each resonator section may include two nested split rings connected via a line segment, and a middle ring that comprises a distributed inductor stub portion shorted to the line segment and connected in electrical series with a distributed capacitor stub portion; first and second amplifiers connected to the coupler, wherein the first amplifier receives a first signal component and the second amplifier receives a second signal component from the coupler; a first offset line connected to an output of the first amplifier and a second offset line connected to an output of the second amplifier, each offset line comprising a second plurality of resonator sections; and a Doherty combiner connected between the first and second offset lines, the Doherty combiner including a third plurality of resonator sections.

Various embodiments also provide for corresponding methods that make use of inventive structures. In one embodiment such a method may comprise: directing a dual-band RF signal to an impedance transformer, the RF signal including two signal components centered at an upper and a lower RF frequency; propagating such a RF signal within said impedance transformer via a plurality of transmission line segments that comprise transmission line segments located on a first side of a circuit substrate; and coupling the RF signal within said impedance transformer with a plurality of resonators, each resonator located proximate to one of the transmission line segments on a second side of said circuit substrate.

In yet another embodiment a second method may comprise: forming a transmission line circuit on one side of a dielectric substrate and having a plurality of transmission line segments configured as an impedance transformer, including at least one transmission line segment configured as a stub segment; and forming a plurality of resonator sections on an opposite side of said dielectric substrate, each resonator section being located proximate to a corresponding one of said transmission line segments, including said stub segment.

Similar to before, the transmission line circuit may comprise a dual-band branch-line coupler, while the impedance transformer may comprise either a Pi-shaped impedance transformer or a T-shaped impedance transformer.

In such a method, the Pi-shaped impedance transformer may comprise serpentine line segment stubs connected to a transmission line segment.

The method may include additional or more particularly steps. For example, the method may further comprise forming each resonator section to include two nested split rings connected via a line segment, and a middle ring that comprises a distributed inductor stub portion shorted to the line segment and connected in electrical series with a distributed capacitor stub portion.

In embodiments of the invention the transmission line circuit may be formed as a microstrip line circuit or slotline circuit. When formed as the former, the resonator sections are formed as complementary resonator sections, while when formed as the latter the resonator sections are formed as normal resonator sections.

Still further, various embodiments provide methods for forming inventive dual-band Doherty amplifiers. One such method may comprise: forming, on a circuit substrate, a dual-branch line coupler that comprises a first plurality of resonator sections; placing on said substrate first and second amplifiers; connecting the first and second amplifiers to the coupler, wherein the first amplifier receives a first signal component and the second amplifier receives a second signal component from the coupler; connecting a first offset line connected to an output of the first amplifier and a second dual-band offset line connected to an output of the second amplifier, each offset line comprising a second plurality of resonator sections; and connecting a Doherty combiner between the first and second offset lines, the Doherty combiner comprising a third plurality of resonator sections.

In such a method, each resonator may be formed as two nested split rings connected via a line segment, and a middle ring that comprises a distributed inductor stub portion shorted to the line segment and connected in electrical series with a distributed capacitor stub portion.

BRIEF DESCRIPTION OF THE DRAWINGS

FIG. 2 depicts a dual-band Pi-shape dual-band impedance transformer according an embodiment of the invention.

DETAILED DESCRIPTION

Figure 1A:
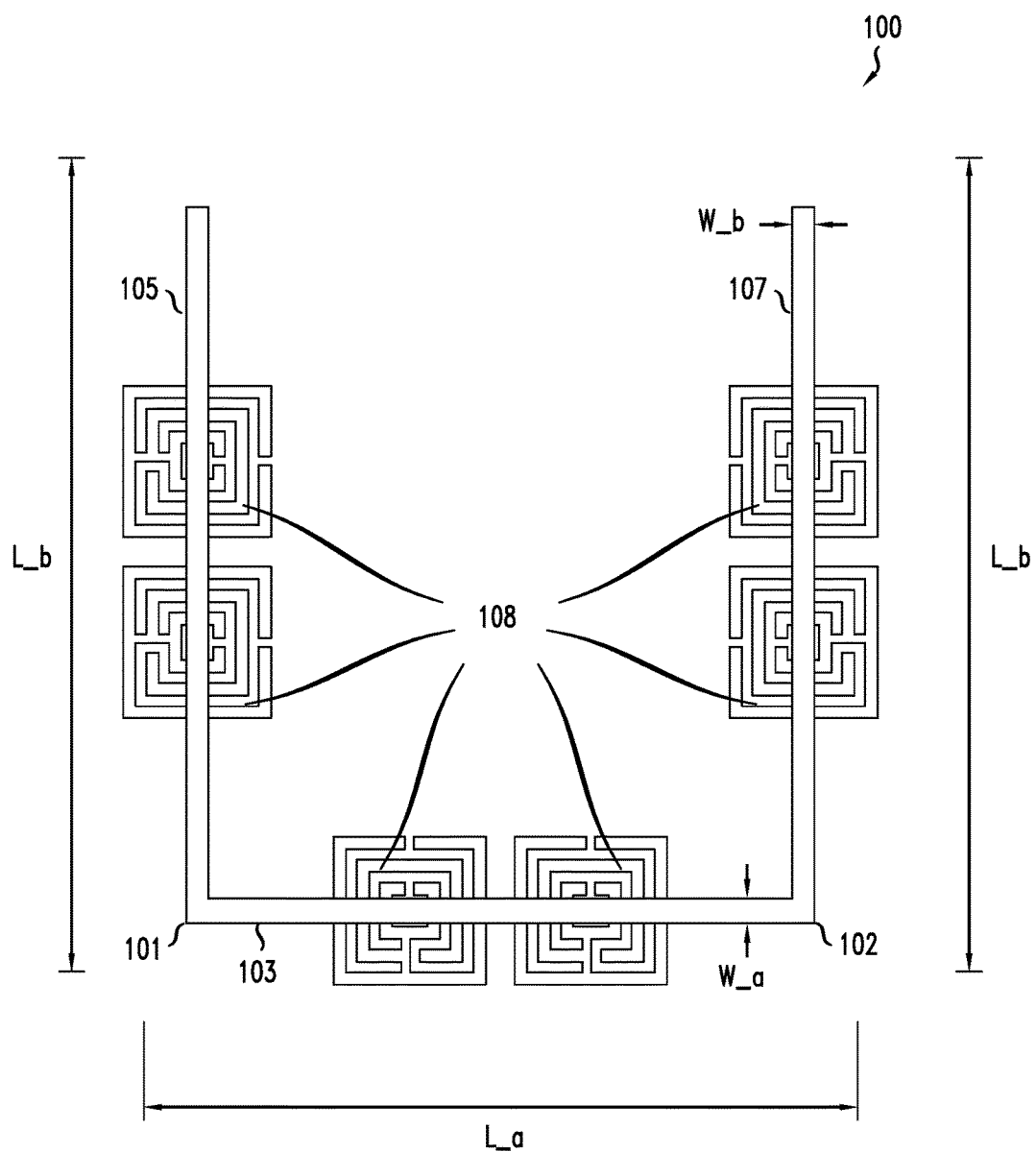
FIG. 1A depicts a simplified diagram of an apparatus according to various embodiments, e.g. including one or more metamaterial-type structures, or resonator sections.

Exemplary embodiments of dual-band RF devices that incorporate metamaterial type structures are described herein and are shown by way of example in the drawings. Throughout the following description and drawings, like reference numbers/characters refer to like elements.

It should be understood that, although specific embodiments are discussed herein, the scope of the disclosure is not limited to such embodiments. To the contrary, it should be understood that the embodiments discussed herein are for illustrative purposes, and that modified and alternative embodiments that otherwise fall within the scope of the disclosure are contemplated.

It should also be noted that one or more exemplary embodiments may be described as a process or method. Although a process/method may be described as sequential, it should be understood that such a process/method may be performed in parallel, concurrently or simultaneously. In addition, the order of each step within a process/method may be re-arranged. A process/method may be terminated when completed, and may also include additional steps not included in a description of the process/method.

As used herein, the term "and/or" includes any and all combinations of one or more of the associated listed items. As used herein, the singular forms "a," "an" and "the" are intended to include the plural form, unless the context and/or common sense indicates otherwise.

It should be understood that when a component or element of an inventive structure is referred to, or shown in a figure, as being "connected" to (or other tenses of connected) another component or element such components or elements can be directly connected, or may use intervening components or elements to aid a connection. In the latter case, if the intervening components and elements are well known to those in the art they may not be described herein.

When the words "first", "second", "third" or other similar words denoting a number are used it should be understood that the use of these words does not denote a level of importance or priority. Rather, such words are used to merely distinguish one component of an inventive structure from another. Relatedly, it should be understood that when layers are described as "first", "second" and "third" layers, for example, that one or more of these layers may be combined to form fewer layers, or, may be further divided to form additional layers. Further, the fact that a device or structure is described as having a particular number of layers does not exclude the device as having additional, non-described layers. Such additional layers are not pertinent to the inventive subject matter discussed herein.

As used herein the terms "apparatus", "device" and "structure" are used synonymously, unless the context indicates otherwise.

As used herein the term "loaded" means a RF line segment or line that includes at least one resonator section that is configured (e.g., positioned) with respect to the line segment, and is configured to resonate at an RF frequency that is greater than nominal operating, center frequencies of a structure that the line segment is a part of. Such loading functions to couple the electromagnetic fields of the resonator section and the line segment and perturbs the electrical transmission characteristics of the line segment. Said another way, each resonator section may be positioned with respect to a respective RF line segment so as to capacitively and inductively couple the respective resonator section to the respective RF line segment. Each such resonator section may be operable to resonate at a desired RF frequency that is higher than frequencies comprising a set of operating center frequencies of the structure (e.g., an upper operating center frequency and a lower operating center frequency) so as to increase affect an electrical length of the respective RF line segment.

Relatedly, as used herein the term "unloaded" means a RF line segment or line that does not include at least one resonator section that is configured with respect to the line segment in order to resonate at an RF frequency that is greater than nominal operating, center frequencies of a structure that the line segment is a part of.

As used herein, the term "embodiment" refers to an exemplary implementation that falls within the scope of the invention(s).

Embodiments described herein benefit from the unique recognition by the inventor that a resonator section as described below may be advantageously used to produce a compact dual-frequency resonant structure such as a Pi-shaped or T-shaped impedance transformer. In the absence of the resonator section, transmission line segments, e.g. stubs, may be too long to use in space-constrained circuits. Those skilled in the pertinent art will recognize that a transmission line stub is a section of transmission line that terminates with an open circuit. When such a stub is loaded by one or more resonator sections, its length may be significantly reduced while having a same resonant frequency as a longer, unloaded analogue of the stub. This recognition provides impedance transformers that may have an effective area of 30% or less of a similar conventional impedance transformer without any change of substrate material, allowing a much greater degree of miniaturization of some RF circuits than previously possible.

Referring now to FIG. 1A there is depicted an RF metamaterial structure 100 (hereafter "structure") that may be formed on a PCB as a transmission line circuit (e.g., a microstrip line circuit) according to an embodiment. As shown, structure 100 may comprise a dual-band, Pi-shaped impedance transformer. Herein and in the claims "Pi-shaped", as applied to an RF structure, means a structure that includes at least three line segments, where two of the line segments meet the third, or central, line segment on a same side at approximately a 90° angle at, or near, opposite ends of the third line segment. It should be understood that although line segments 105, 107 are depicted as straight line segments (i.e., rectilinear), this is merely one example. Said another way, none of the line segments is limited to being a straight segment. More specifically, the structure 100 may include a main transmission line segment 103, and open stub line segments 105 and 107. For convenience, open stub line segment 105 may be referred to herein as "first" open stub line segment 105 and open stub line segment 107 may be referred to herein as "second" open stub line segment 107. It should be noted that structure 100 may be oriented in many different directions. Collectively, components 103, 105 and 107 may be referred to as "line segments".

Structure 100 further comprises an input port or section 101 for receiving an input signal having an input voltage and input frequency, both of which may vary. Input port 101 may be formed by the junction of first open stub line segment 105 and the main transmission line segment 103. Structure 100 further comprises an output port or section 102 for outputting an output voltage and an output frequency, both of which may vary. Output port 102 may be formed at the junction of second open stub line segment 107 and main transmission line segment 103.

In the case where the structure 100 (or any of the structures shown in the figures or described herein) comprises an impedance transformer, it should be understood that the output voltage may vary depending on the input voltage, and on the thicknesses of the various layers of structure 100 described further herein, where a particular thickness results in an impedance transformation ratio. For example, the structure may be used to transform a signal using dual-band frequencies of 700 MHz and 1900 MHz received via a circuit path having a 25 Ohm characteristic impedance to a signal further propagated via a circuit path having a 100 Ohm characteristic impedance.

Figure 1B:
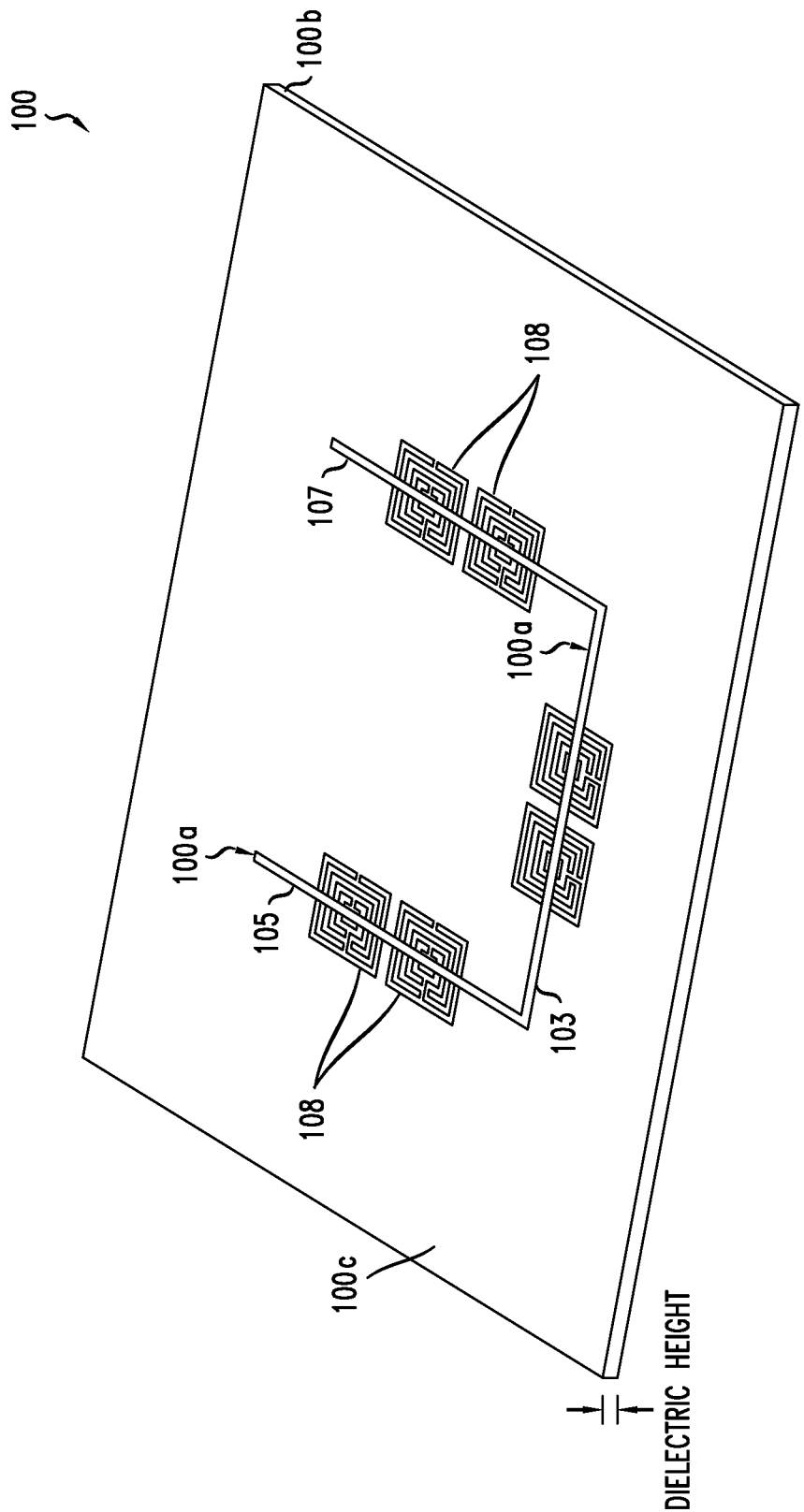
FIG. 1B depicts another view of the structure set forth in FIG. 1A, including aspects of the substrate on which the structure is formed.

Referring now to FIG. 1B, the structure 100 is shown in plan view as implemented on a double-sided circuit board. As shown, the structure is a microstrip line circuit that comprises a first or top layer (e.g., copper conductor) 100a, a bottom, second or ground layer (e.g., copper ground plane) 100b, and a middle or third dielectric layer 100c.

In one embodiment, line segments 103, 105 and 107 may be formed from a copper conductor, but embodiments are not limited to any particular metallization.

Except as noted elsewhere herein, the bottom ground plane 100b may extend or otherwise run throughout the structure 100, except, for example, where there are passageways or vias that go through the structure 100.

The structure 100 (e.g., a dual-band, Pi-shaped impedance transformer) may further include one or more resonator sections 108 (e.g., six sections 108 in FIGS. 1A and 1B), that may be referred to collectively and equivalently as resonator 108. These sections 108 may be referred to herein as "metamaterial resonators". Those skilled in the art will appreciate that the term "metamaterial" may refer to a synthetic composite material whose structure exhibits properties not usually found in natural materials, especially a negative refractive index in a frequency range of interest. In the context of the transmission line segments 103, 105, 107, such lines may be described as having a characteristic impedance that is a function of the unit capacitance and the unit inductance of the transmission line. Without limitation, these characteristics may be respectively viewed as being dependent on a relative dielectric permittivity $\in_r$ and a magnetic permeability $\mu_r$ as seen by the transmission line. Moreover, the refractive index, $n_i$, experienced by a signal propagating on the line segments 103, 105, 107 may be described by $\sqrt{\in_r \mu_r}$. The resonator sections 108 may thus be configured to impart metamaterial characteristics to the transmission line formed by line segments 103, 105, 107 in accordance with a particular, example design.

More specifically, in an embodiment the structure 100 may include at least two resonator sections 108 configured (e.g., positioned) with respect to main transmission line segment 103. In an embodiment, the two sections 108 are configured to resonate at an RF frequency that is greater than nominal operating, center frequencies of the structure 100. Accordingly, the configuration of the sections 108 with respect to the main transmission line segment 103 functions to couple the electromagnetic fields of the sections 108 and the line segment 103 and to perturb the electrical transmission characteristics of the line segment 103. Said another way, each of the sections 108 may be positioned with respect to a respective RF line segment (e.g., segment 103) so as to capacitively and inductively couple the respective resonator section 108 to a respective RF line segment. Each resonator section 108 may be operable to resonate at a desired RF frequency that is greater than frequencies comprising a set of operating center frequencies of a structure (e.g., an upper operating center frequency and a lower operating center frequency) so as to increase an electrical length of the respective RF line segment (e.g., segment 103) upon operation of the structure. Thus, it is possible to reduce the physical length of the line segment (and an overall line) while maintaining about a same electrical length as a traditional unloaded line segment.

More specifically, the configuration of the sections 108 with respect to the line segment 103 functions to alter the permittivity and permeability of line segment 103. Sections 108 may be configured such that they are located parallel to main transmission line segment 103.

In addition to resonator sections 108 positioned with respect to main transmission line segment 103, additional resonator sections 108 (e.g., four sections 108) may be incorporated into the structure 100. In an embodiment, two sections 108 may be configured such that they are located parallel to each open stub line segment 105, 107. More specifically, two sections 108 are located parallel to first open stub line segment 105 and two sections 108 are located parallel to the second open stub line segment 107. Accordingly, the configuration of the sections 108 with respect to the line segments 105, 107 functions to couple electromagnetic fields of the sections 108 and the line segments 105, 107 and to perturb the electrical transmission characteristics of the line segments 105, 107. More specifically, the configuration of the sections 108 with respect to each respective line segment 105, 107 functions to alter the permittivity and permeability of each respective line segment 105, 107.

It should be understood that the resonator sections 108 described herein may be formed as "normal" or "complimentary" elements. For example, when copper conductor is etched away from the area surrounding a resonator section (sometimes referred to as field copper), leaving copper in the form of the shape of a section, this is referred to as a "normal" structure. However, when copper conductor is left surrounding a section, but is etched away to form the shape of a section the section is said to be formed as a "complimentary" structure. Without limitation, a normal resonator section may be used in proximity to a slotline transmission line, while a complementary resonator section may be used in proximity to a microstrip transmission line. Both types of resonator sections fall within the scope of the description and the claims unless explicitly limited by terms in the claims set forth at the end of this description.

Figure 1C:
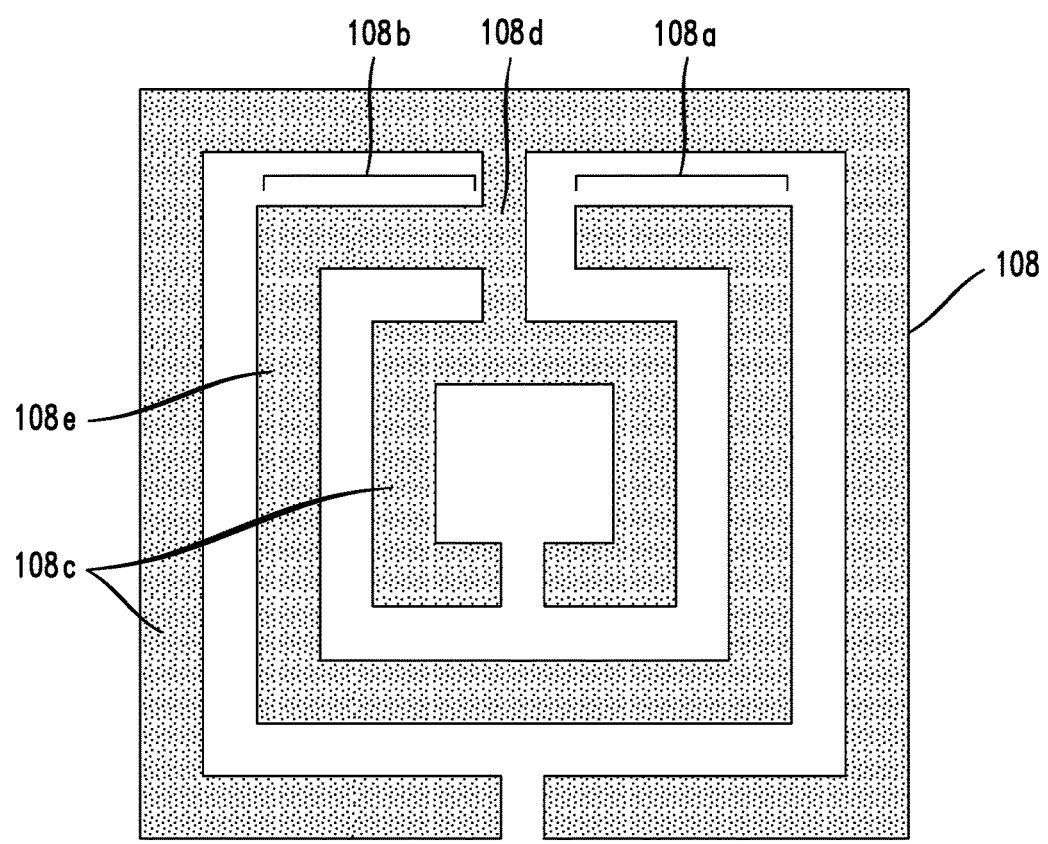
FIG. 1C depicts a conventional resonator section.

Referring now to FIG. 1C, there is depicted a close up view of an individual resonator section 108. As shown, in one embodiment the section 108 may comprise two nested split (square) rings 108c connected via a line segment 108d, and a middle ring 108e that includes a distributed inductor stub portion 108b shorted to the line segment 108d and connected in electrical series with a distributed capacitor stub portion 108a. Various aspects of the resonator section are described in Ousama Abu Safia, et al., "A new type of transmission line-based metamaterial resonator and its implementation in original applications," IEEE Transactions on Magnetics 49.3 (2013): pp. 968-973, incorporated herein in its entirety as if set forth in full herein. While the distributed stub portions 108a and 108b are shown and referred to as discrete elements, those skilled in the pertinent art will appreciate that the inductance and capacitance of the middle ring 108e are distributed along the length of the middle ring 108e. A resonator section 108 configured in this manner may be operable to cause an impedance perturbation, e.g. a discontinuity, in the frequency-dependent impedance characteristics of an associated adjacent transmission line segment, e.g. a co-planar waveguide (CPW) transmission line. The stub portions 108a, 108b may be oriented (i.e., positioned) such that their respective long axes are about (i.e., approximately) parallel to a direction an electrical signal propagates in the associated, corresponding adjacent transmission line segment. Thus, for example, referring to FIG. 1A, the long axes of the stub portions 108a, 108b of the resonator sections 108 proximate the line segment 107 may be oriented parallel to the long axis of the line segment 107, i.e. the direction of signal propagation in that line segment.

In the embodiments depicted in FIGS. 1A through 5 the resonator sections 108 may be configured or formed having a "square" footprint or shape. It should be understood, however, that although sections 108 are depicted as having a square foot print, this is merely one example of many possible footprints or shapes. Said another way, the shape of the resonator sections contemplated in this disclosure may take on any number of shapes in addition to square. Examples include rectangular, circular, triangular, or more generally any regular or irregular 2-D polygon. That said, regardless of shape, it is expected that in preferred embodiments, each resonator section is configured to include an open-ended stub (distributed capacitive path) in series with a short-ended stub (distributed inductive path).

In more detail, the resonator sections 108 may take any number of shapes and forms in which it is preferred that the series resonant circuits making up the sections (e.g., short ended stubs and the open-ended stubs) lengths are optimized to have a length equal to or less than $\lambda_g/8$; where $\lambda_g$ is the CPW transmission line wavelength.

As mentioned before, structure 100 may comprise a dual-band, Pi-shaped transformer. In a more specific embodiment, such a transformer may be configured to simultaneously operate at frequencies of 750 MHz and 1965 MHz, for example, and may include resonator elements 108 (e.g., 4 elements) that are configured to resonate at a frequency of approximately 4.8 GHz, for example. With respect to the Pi-shaped transformer, by "simultaneously operate" it is meant that the transformer is able to effectively couple signals at each of one or more center frequencies. For example, as described more fully below with respect to FIG. 1E, the structure 100 may have a plurality of return loss local minima (denoted "S11" (scattering parameter) in FIG. 1E) at corresponding center frequencies, indicating effective coupling at each of the center frequencies.

Without limitation, it is believed that by loading a transmission line segment with resonator section(s) 108, the energy of a signal propagating in the transmission line segment is strongly coupled to the resonator section at a certain frequency band and thereby excites the resonator section 108. The level of coupling is thought to strongly depend on the topology of the resonator section, the transmission line segment (and line) and the frequency of operation. The presence of a resonator section 108 is thought to increase the effective relative dielectric permittivity of the substrate and thus electrical length of the line segment. Thus, the physical length of the line segment (and line) may be reduced while maintaining performance that is the same as an unloaded, longer transmission line.

Moreover, the coupling may reduce the electrical width of the transmission line segment, which in turn requires compensating by forming the physical line segment with a greater width than an unloaded transmission line. The inventor has recognized that this factor may be exploited to increase the process margin of the process used to produce a transmission line, e.g. a wet chemical etch. To the extent the width of the transmission line segment varies due to inherent variations in the process the effect of such a variation is reduced when the width of a transmission line segment is wider. Thus, when the physical transmission line width is increased to accommodate the reduced electrical line width, the effect of variations in the process is expected to be reduced both within a single device such as the structure 100, but also between different instances of the structure 100. This effect on line width may in some cases make it possible to manufacture a device that would not otherwise be manufacturable due to a small computed physical line width of an unloaded transmission line segment (and line).

In an exemplary embodiment, presented without limitation, the inclusion of elements 108 within structure 100 allows the physical length of the transmission line segment 103 and the open stubs 105 and 107 to be reduced by −26% and 20%, respectively, while the line segment width is increased by 2% for both the line segment 103 and the open stubs 105 and 107. In this embodiment, this increase of physical line width makes it feasible to manufacture a structure having such a line segment width.

For the reader's benefit, we provide as one example the following explanation as to how an electrical length may be computed.

Figure 1D:
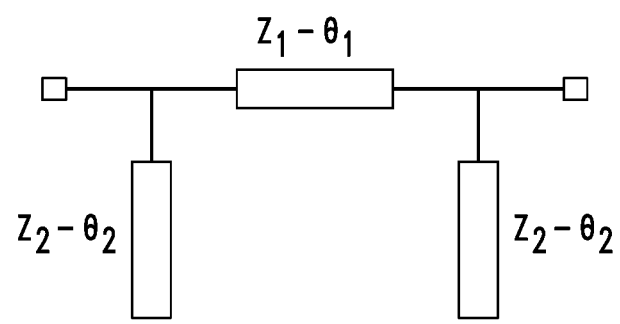
FIG. 1D is a diagram of an electrical representation of a dual-band Pi impedance transformer according to an embodiment of the invention.
Figure 1E:
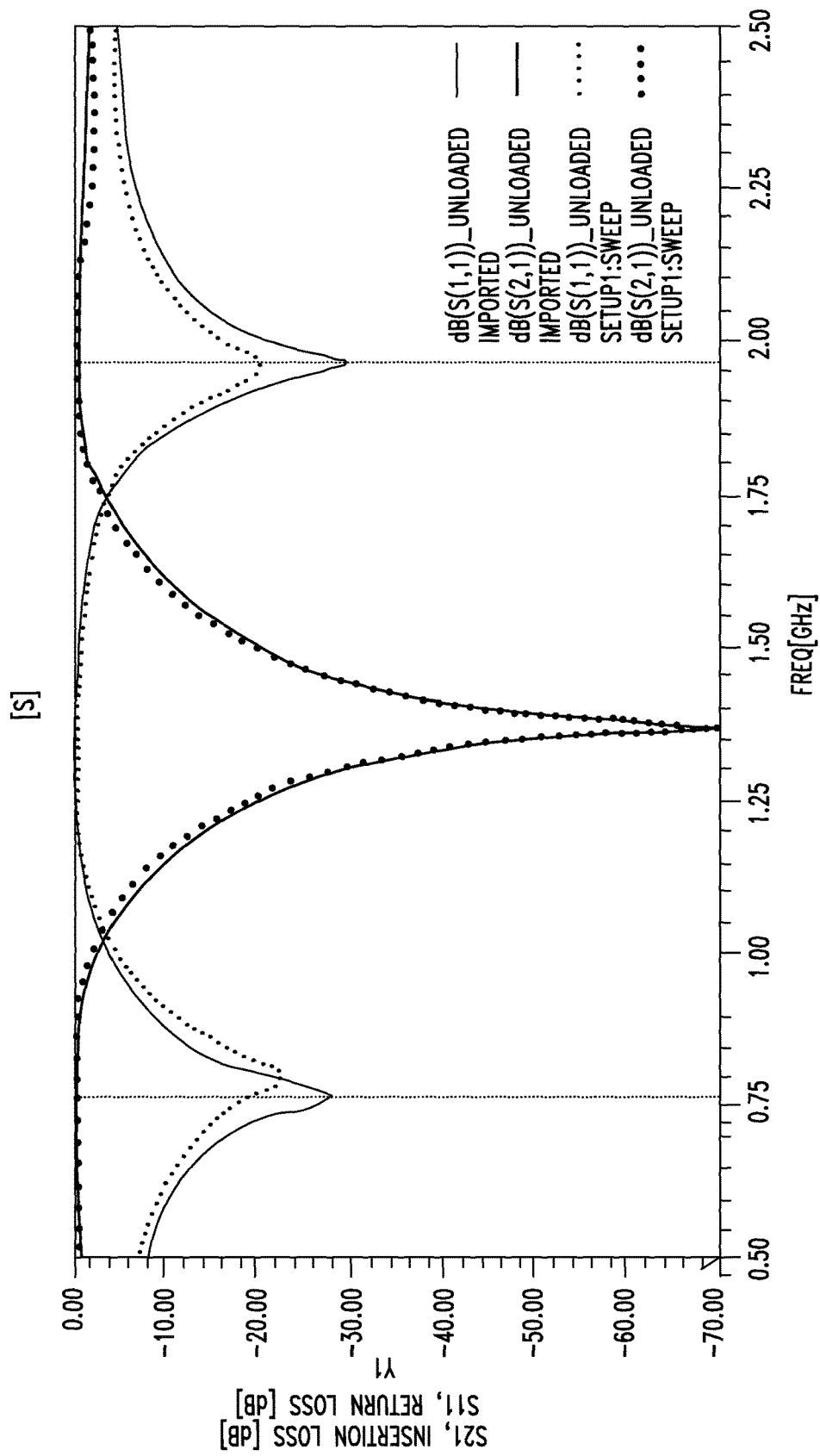
FIG. 1E graphically illustrates insertion loss and return loss for an embodiment of an inventive structure.

FIG. 1D represents an electrical representation of a Pi-junction dual-band impedance transformer. The Pi-junction comprises one microstrip transmission line segment with the characteristic impedance and electrical length of $Z_a$ and $\theta_a$, respectively, and two microstrip transmission line segments with the characteristic impedance and electrical length of $Z_b$, and $\theta_b$, respectively. The dual-band behavior of such a network can be shown using network analysis of an equivalent two-port network. The equivalent [ABCD] matrix of such a network can be written as Equation 1.1 below:

$$\begin{bmatrix} A & B \\ C & D \end{bmatrix} = \begin{bmatrix} 1 & 0 \\ \frac{j}{Z_b}\tan(\theta_b) & 1 \end{bmatrix} \begin{bmatrix} \cos(\theta_a) & jZ_a\sin(\theta_a) \\ \frac{j}{Z_a}\sin(\theta_a) & \cos(\theta_a) \end{bmatrix} \quad \text{(Equation 1.1)}$$

$$\begin{bmatrix} 1 & 0 \\ \frac{j}{Z_b}\tan(\theta_b) & 1 \end{bmatrix} = \begin{bmatrix} 0 & \pm jZ_\Pi \\ \pm \frac{j}{Z_\Pi} & 0 \end{bmatrix}$$

Equation (1.1) can be simplified as:

$$\begin{bmatrix} 0 & \pm jZ_\Pi \\ \pm \frac{j}{Z_\Pi} & 0 \end{bmatrix} = \quad \text{(Equation 1.2)}$$

-continued $$\begin{bmatrix} \cos(\theta_a) - \frac{Z_a}{Z_b}\sin(\theta_a)\tan(\theta_b) & jZ_a\sin(\theta_a) \\ \frac{2j}{Z_b}\cos(\theta_a)\tan(\theta_b) + \frac{j}{Z_a}\sin(\theta_a) - & \cos(\theta_a) - \\ \frac{jZ_a}{Z_b^2}\sin(\theta_a)\tan^2(\theta_b) & \frac{Z_a}{Z_b}\sin(\theta_a)\tan(\theta_b) \end{bmatrix}$$

In Equation 1.2 above, the electrical lengths of the line segments $\theta_i$ (i =a or b) may be determined by the operational frequencies. For instance, for line segment a with the physical length of l operating at two frequencies of $F_1$ and $F_2$:

$$\frac{\theta_{a1}}{\theta_{a2}} = \frac{\beta_1 l}{\beta_2 l} = \frac{F_1}{F_2} \quad \text{(Equation 1.3)}$$

Since $\theta_{a2} = \pm\theta_{a1} + \pi$ then  (Equation 1.4a)

$$\theta_{a1} = \frac{\pi\frac{F_1}{F_2}}{1 \mp \frac{F_1}{F_2}},$$

$$\theta_{a2} = \frac{\pi}{1 \mp \frac{F_1}{F_2}}. \quad \text{(Equation 1.4b)}$$

Further, because $\theta_{b1}$ and $\theta_{b2}$ are governed by the same equations as Equations 1.4, the characteristic impedance $Z_a$, $Z_b$ of the line segments can also be obtained, namely:

$$Z_a = \frac{\mp Z_\Pi}{\sin(\theta_a)}, \quad \text{(Equation 1.5a)}$$

$$Z_b = Z_a\tan(\theta_a)\tan(\theta_b). \quad \text{(Equation 1.5b)}$$

In various embodiments, the physical length of the line segments making up an inventive microstrip line circuit, for example, are reduced relative to a known, conventional unloaded circuit, while maintaining substantially similar RF performance and characteristics as compared to such an unloaded circuit. Further, when an inventive microstrip line circuit that includes resonator sections (e.g., sections 108) is used in a dual-band impedance transformer or in a branch line coupler, the size of these structures may be reduced by approximately 30% relative to corresponding, conventional unloaded devices, thereby resulting in a space savings of about 50% or more on a PCB.

More particularly, in an embodiment, the length of main transmission line segment 103 (denoted "L_a" in FIG. 1A) e.g., the dimension from input port 101 to output port 102, may be 24.19 mm, for example, and the width (denoted "W_a" in FIG. 1A) may be 1.1604 mm, for example. The length of each open stub line segment 105, 107 (denoted "L_b" in FIG. 1A) may be 27.11 mm, for example, where the length for first open stub line segment 105 is the dimension running from input port 101 to the opposite, open end, of line segment 105, and the length for second open stub line segment 107 is the dimension running from output port 102 to the opposite, open end, of second line segment 107. Further, in an embodiment the width (denoted "W_b" in FIG. 1A) of line segments 105, 107 may be 0.5463 mm, for example.

FIG. 2 depicts a second illustrative embodiment of an inventive structure 200, As shown, structure 200 may comprise a dual-band Pi-shape impedance transformer that includes two resonator sections 108 (instead of four in FIG. 1A) configured with respect to a main transmission line segment 203, and two serpentine open-stub lines 205 and 207 attached at respective ends of the central transmission line segment 203. In an embodiment, the two sections 108 are configured to resonate at an RF frequency that is greater than the target operating center frequencies of the structure 200. For example, the resonant frequency of the resonator section 108 may be about 4.8 GHz, while the target dual center frequencies of the structure 200 may be about 750 MHz and about 1.965 GHz (i.e., lower center frequency and upper center frequency). Accordingly, the configuration of the sections 108 with respect to the main transmission line segment 203 functions to couple electromagnetic fields of the sections 108 and the line segment 203 and to perturb the electrical transmission characteristics of the main transmission line segment 203. More specifically, the configuration of the sections 108 with respect to the main transmission line segment 203 functions to increase the effective relative dielectric permittivity of the substrate as seen by the line segment 203, reducing the electrical length and increasing the width of the transmission line segment 203. In the inventive structure 200, the open-stub line segments 205 and 207 have been shaped (e.g., bent) to form a serpentine shape in order to make the dual-band impedance transformer much more compact. In this case, resonator sections 108 are only included in (e.g., placed adjacent to) the main transmission line segment 203.

Figure 3:
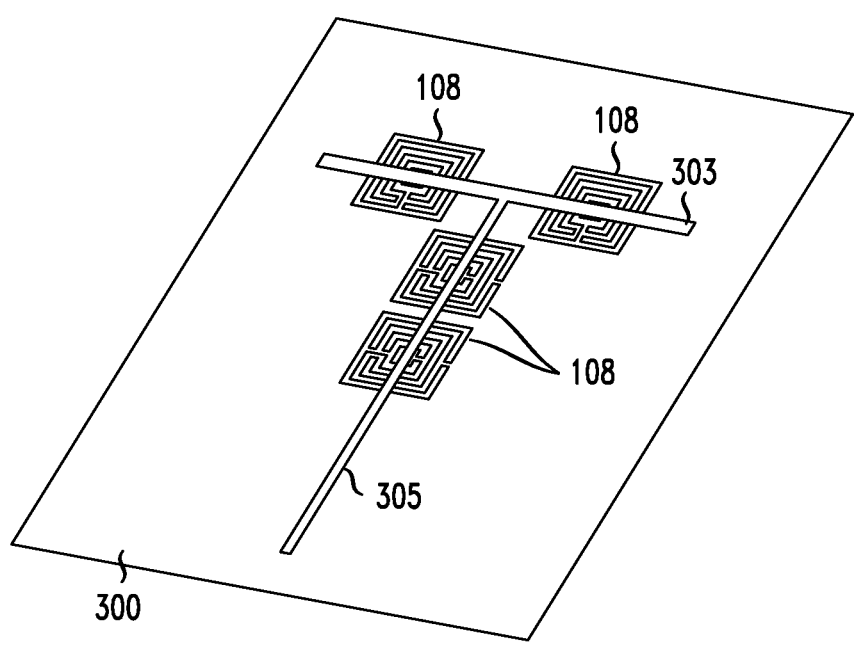
FIG. 3 depicts a T-shaped, dual band impedance transformer that includes Pi-shaped according to an embodiment of the invention.

FIG. 3 shows another illustrative structure 300 according to another embodiment. In particular, structure 300 may comprise a T-shaped, dual band impedance transformer including a transmission line segment 303 and a transmission line segment 305. Herein and in the claims, "T-shaped" means the element includes two line segments, wherein a first line segment (e.g., segment 305) terminates at about the middle of a second line segment (e.g., segment 303), and forms an approximately 90° angle with the second line segment. The illustrated transformer includes four resonator sections 108. The sections 108 may be aligned with respect to the transmission line segment 303, and the open stub line segment 305, such that the sections 108 underlie the segments 303, 305 on an opposite side of a circuit substrate, and are about centered with respect to their corresponding segments 303, 305. The sections 108 may further be oriented such that the stub portions 108a,b are oriented about parallel to the corresponding associated line segment 303 or 305. The sections 108 may each resonate at an RF frequency (e.g. 4.8 GHz) that is higher than the target operating frequency range of the structure 300 (e.g., 750 MHz and 1.965 GHz). Accordingly, the configuration of the sections 108 with respect to the line segments 303, 305 functions to couple electromagnetic fields of the line segments 303, 305 to the corresponding associated sections 108, thereby increasing the effective relative dielectric permittivity experienced by a signal propagating in the line segments 303, 305. Thus, the electrical lengths of the line segments 303, 305 are reduced and the electrical widths are increased, allowing the structure 300 to be made significantly smaller than a conventional, unloaded structure.

Figure 4:
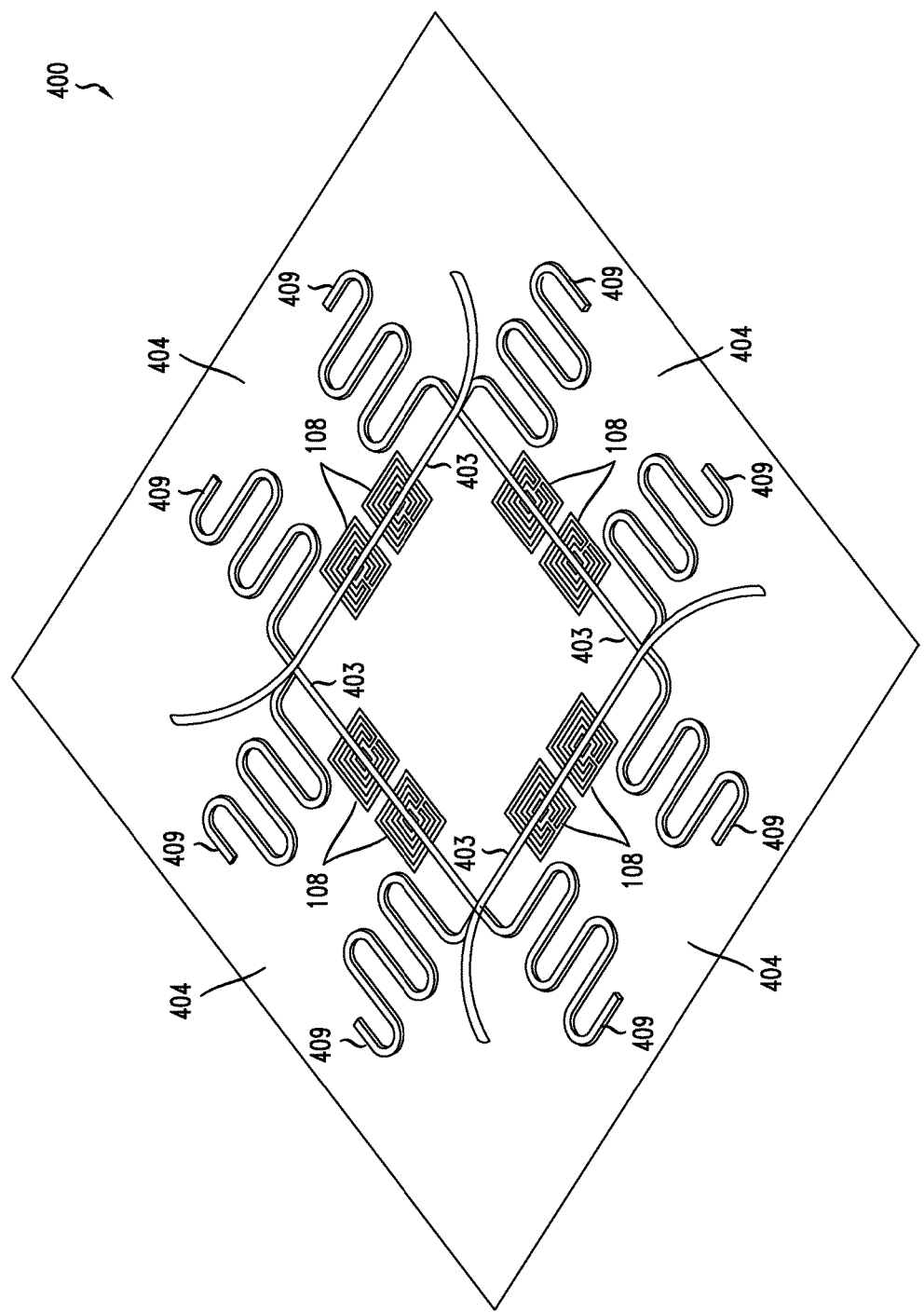
FIG. 4 depicts a compact, dual-band branch-line coupler that includes Pi-shaped impedance transformers according to an embodiment of the invention.

Referring to FIG. 4, there is depicted an illustrative compact, dual-band branch-line coupler 400 comprising four dual-band, Pi-shape impedance transformers 404 that include resonator sections 108 and serpentine stubs 409 connected to central transmission line segments 403. The dual-band branch-line coupler may be operable to combine and/or split power using dual-band operating frequencies of 720 MHz and 1965 MHz, respectively. It should be understood that the operation of such a coupler is not limited to these two frequencies. The inventive principles described with respect to other embodiments herein, e.g. the structure 200, are applicable to the coupler 400.

Figure 5:
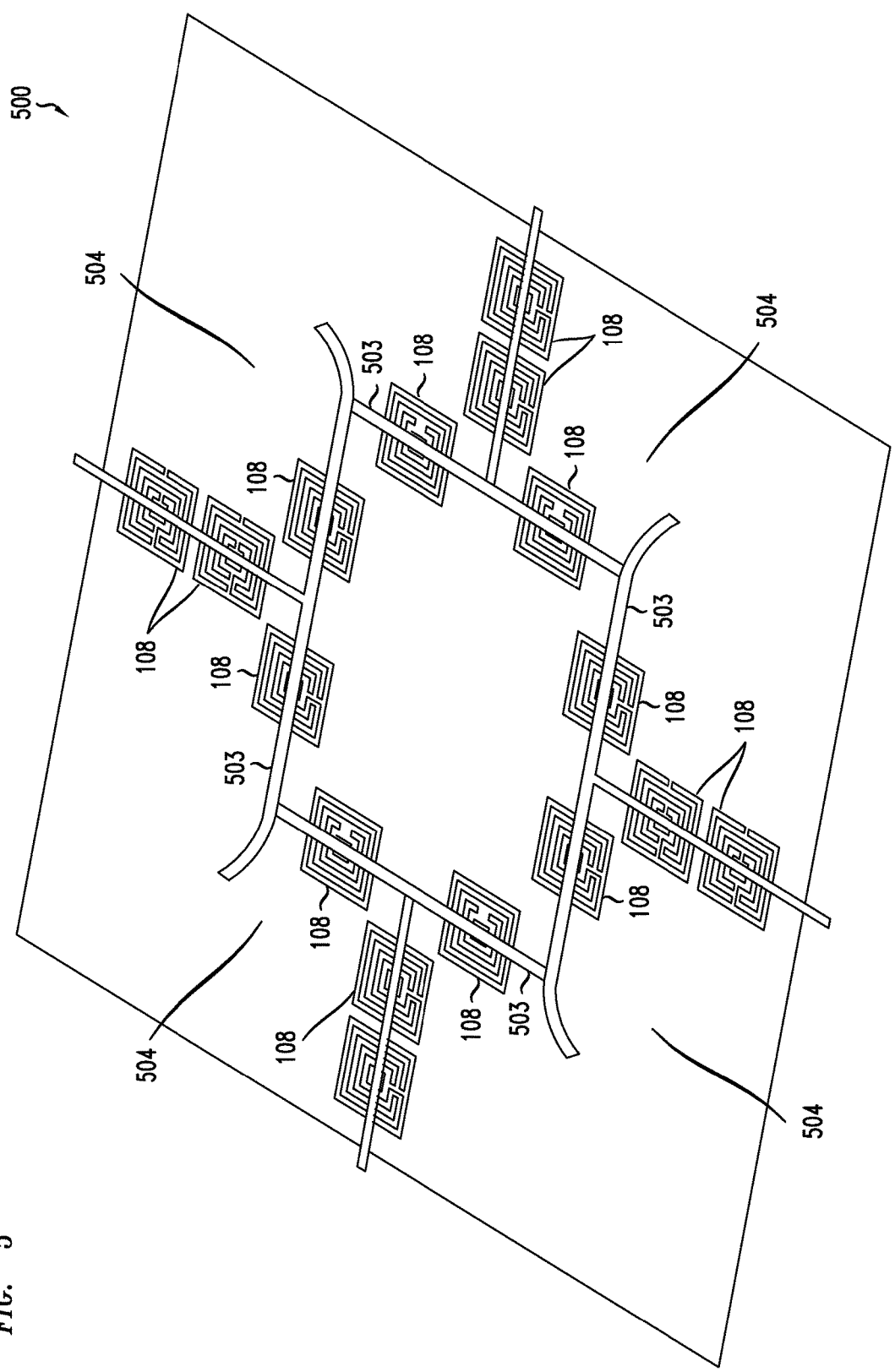
FIG. 5 depicts a compact, dual-band branch-line coupler that includes T-shaped impedance transformers according to an embodiment of the invention.

Referring now to FIG. 5, there is depicted an illustrative dual-band branch-line coupler 500 comprising four dual-band, T-shaped impedance transformers 504 that include resonator sections 108. Each of the resonator sections 108 in FIGS. 4 and 5, are configured with respect to a transmission line segment 403, 503, respectively, to perturb the electrical transmission characteristics of its associated transmission line segment 403, 503. More specifically, the configuration of the sections 108 with respect to a transmission line segment 403, 503 functions to increase the effective relative dielectric permittivity experienced by the signal propagating in the respective line segment 403, 503.

Still further, additional inventive structures may be formed using the dual-band, branch line segment couplers 400, 500. For example, one such structure may comprise a dual-band power combiner while a second structure may comprise a dual-band power splitter both operable to support simultaneous transmission and/or reception of two different RF frequencies.

Figure 6:
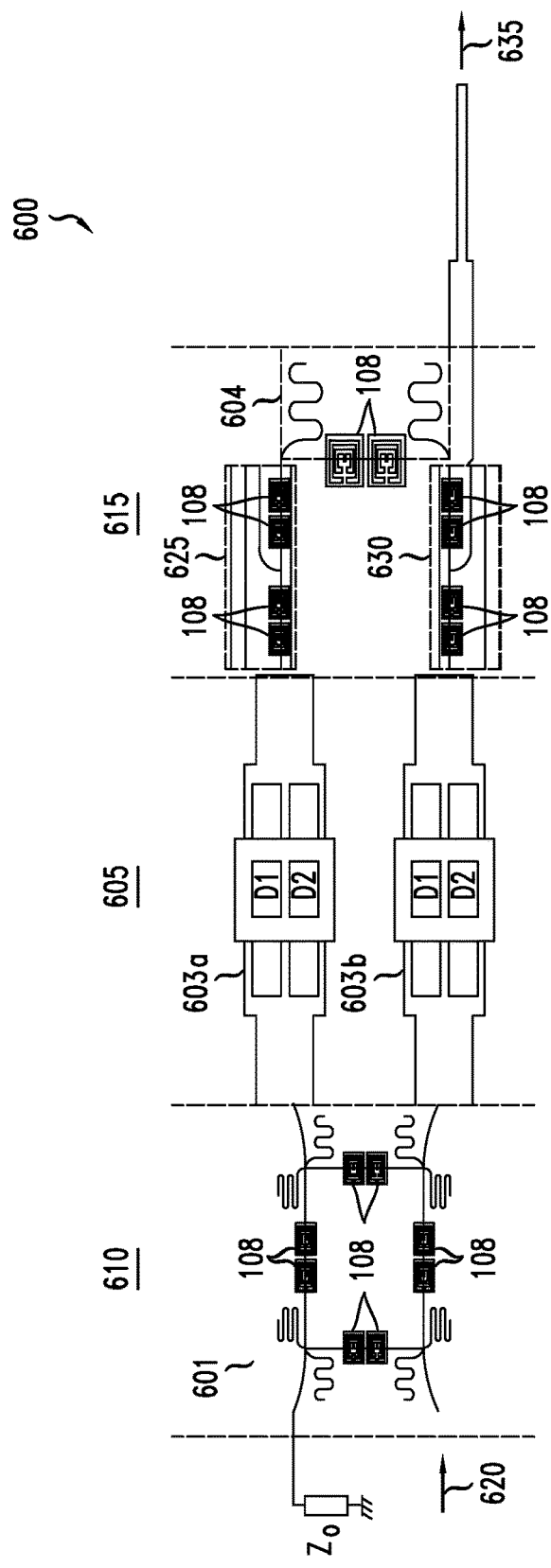
FIG. 6 depicts an exemplary Doherty amplifier according to an embodiment of the invention

FIG. 6 presents yet another embodiment of a structure 600. As depicted, structure 600 comprises a dual-band Doherty amplifier that includes one or more resonator sections 108. The inventor has recognized that elements of embodiments described herein may be advantageously applied to configure an inventive dual-band Doherty amplifier as a compact, dual-band device. By "dual-band", it is meant that the structure 600 is configured to receive and amplify a dual-band RF signal. Referring to FIG. 6 the illustrated structure 600 includes an input stage 605, an amplification stage 610, and an output stage 615. The input stage 605 is implemented using a dual-branch line coupler 601 that receives an input signal 620 that may be a dual-band signal. The coupler 601 produces a first signal component and a second signal component. In the amplification stage 610, a first amplifier (e.g. main amplifier) 603a receives the first signal component from the coupler 601, and a second amplifier (e.g. peak amplifier) 603b receives the second signal component from the coupler. The amplifiers 603a,b are shown without limitation as being implemented by power transistors. In the output stage 615, a first dual-band offset line 625 receives the output of the amplifier 603a, and a second dual-band offset line 630 receives the output of the amplifier 603b. A dual-band Doherty combiner 604 connected between the first and second offset lines provides a π/2 phase shift to a dual-band signal from the offset line 625, which is combined with a signal from the offset line 630 to produce an output signal 635.

Each transmission line segment within the input stage 605 and the output stage 615 is associated with at least one, and illustratively two, resonator sections 108. As described in the previous embodiments, the resonator sections 108 electrically lengthen and narrow the associated transmission line segment. Thus, the transmission line segments may be made shorter and wider yet still provide similar performance when compared to transmission line segments used in a Doherty amplifier implemented without the resonator sections 108. Thus, the Doherty amplifier 600 may be made smaller in both horizontal and vertical dimensions, and the transmission line segments may be more robust to manufacturing variation.

The foregoing description only describes a few of the many possible embodiments that fall within the scope of the disclosure. Numerous changes and modifications to the embodiments disclosed herein may be made without departing from the general spirit of the disclosure, the scope of which is best defined by the claims that follow.

What is claimed is:

1. A radio-frequency (RF) structure, comprising:
    a dielectric substrate;
    an impedance transformer formed on one side of said dielectric substrate and comprising a plurality of transmission line segments including at least one transmission line segment configured as a stub segment; and
    a plurality of resonator sections formed on an opposite side of said dielectric substrate, each resonator section comprising stub portions, and being located proximate to a corresponding one of said transmission line segments, including said stub segment.

2. The RF structure as in claim 1, wherein said impedance transformer comprises a Pi-shaped impedance transformer or a T-shaped impedance transformer.

3. The RF structure as in claim 1, wherein said impedance-transformer is configured to operate as a dual-band transformer having an upper operating center frequency and a lower operating center frequency, and each of said resonator sections is configured to resonate at a resonant frequency greater than said upper operating center frequency.

4. The RF structure as in claim 2, wherein said impedance transformer comprises a Pi-shaped impedance transformer that comprises serpentine line stub segments connected to a transmission line segment.

5. The RF structure as in claim 1, wherein one of said transmission line segments comprises a dual-band branch-line coupler.

6. The RF structure as in claim 1, wherein each stub portion of each resonator section further comprises a distributed inductor stub portion and a distributed capacitor stub portion, wherein said distributed inductor stub portion and said distributed capacitor stub portion are oriented about parallel to a corresponding transmission line segment.

7. The RF structure as in claim 1, wherein said stub segment comprises a microstrip line circuit, and said resonator sections are complementary resonator sections.

8. The RF structure as in claim 1 wherein said stub segment comprises a slotline circuit, and said resonator sections are normal resonator sections.

9. A dual-band Doherty amplifier comprising:
    a dual-branch line coupler, configured to receive a dual-band radio-frequency signal, that comprises a first plurality of resonator sections, each resonator section including two nested split rings connected via a line segment, and a middle ring that comprises a distributed inductor stub portion shorted to the line segment and connected in electrical series with a distributed capacitor stub portion;
    first and second amplifiers connected to the coupler, wherein the first amplifier receives a first signal component and the second amplifier receives a second signal component from the coupler;
    a first offset line connected to an output of the first amplifier and a second offset line connected to an output of the second amplifier, each offset line comprising a second plurality of resonator sections; and
    a Doherty combiner connected between the first and second offset lines, the Doherty combiner including a third plurality of resonator sections.

10. A method of propagating a radio-frequency (RF) signal, comprising:
    directing a dual-band RF signal to an impedance transformer, the RF signal including two signal components centered at an upper and a lower RF frequency;
    propagating said RF signal within said impedance transformer via a plurality of transmission line segments that comprise transmission line segments located on a first side of a circuit substrate; and
    coupling said RF signal within said impedance transformer with a plurality of resonators, each resonator comprising stub portions, and located proximate to one of the transmission line segments on a second side of said circuit substrate.

11. A method of forming a radio-frequency (RF) structure, comprising:
    forming a transmission line circuit on one side of a dielectric substrate and having a plurality of transmission line segments configured as an impedance transformer, including at least one transmission line segment configured as a stub segment; and
    forming a plurality of resonator sections on an opposite side of said dielectric substrate, each resonator section comprising stub portions, and being located proximate to a corresponding one of said transmission line segments, including said stub segment.

12. The method as in claim 11, wherein said impedance transformer comprises a Pi-shaped impedance transformer.

13. The method as in claim 12, wherein said Pi-shaped impedance transformer comprises serpentine line segment stubs connected to a central transmission line segment.

14. The method as in claim 11 wherein said impedance transformer comprises a T-shaped impedance transformer.

15. The method as in claim 11, wherein said transmission line circuit comprises a dual-band branch-line coupler.

16. The method as in claim 11 further comprising forming each of said resonator sections to comprise two nested split rings connected via a line segment, and a middle ring that comprises a distributed inductor stub portion shorted to the line segment and connected in electrical series with a distributed capacitor stub portion.

17. The method as in claim 11, wherein said transmission line circuit comprises a microstrip line circuit, and further comprising forming said resonator sections as complementary resonator sections.

18. The method as in claim 11 wherein said transmission line circuit comprises a slotline circuit, and further comprising forming said resonator sections as normal resonator sections.

19. A method for forming a dual-band Doherty amplifier comprising:
    forming, on a circuit substrate, a dual-branch line coupler that comprises a first plurality of resonator sections;
    placing on said substrate first and second amplifiers;
    connecting the first and second amplifiers to the coupler, wherein the first amplifier receives a first signal component and the second amplifier receives a second signal component from the coupler;
    connecting a first offset line connected to an output of the first amplifier and a second dual-band offset line connected to an output of the second amplifier, each offset line comprising a second plurality of resonator sections; and
    connecting a Doherty combiner between the first and second offset lines, the Doherty combiner comprising a third plurality of resonator sections.

20. The method as in claim 19 further comprising forming each resonator as two nested split rings connected via a line segment, and a middle ring that comprises a distributed inductor stub portion shorted to the line segment and connected in electrical series with a distributed capacitor stub portion.

21. A radio-frequency (RF) structure, comprising:
a dielectric substrate;
an impedance transformer formed on one side of said dielectric substrate and comprising a plurality of transmission line segments including at least one transmission line segment configured as a stub segment, wherein said impedance transformer comprises a Pi-shaped impedance transformer comprising serpentine line stub segments connected to a transmission line segment or a T-shaped impedance transformer; and
a plurality of resonator sections formed on an opposite side of said dielectric substrate, each resonator section being located proximate to a corresponding one of said transmission line segments, including said stub segment.

22. A radio-frequency, dual-band branch-line coupler comprising:
a dielectric substrate;
an impedance transformer formed on one side of said dielectric substrate and comprising a plurality of transmission line segments including at least one transmission line segment configured as a stub segment; and
a plurality of resonator sections formed on an opposite side of said dielectric substrate, each resonator section being located proximate to a corresponding one of said transmission line segments, including said stub segment.

23. A radio-frequency structure, comprising:
a dielectric substrate;
an impedance transformer formed on one side of said dielectric substrate and comprising a plurality of transmission line segments including at least one transmission line segment configured as a stub segment, the stub segment comprising a microstrip line circuit; and
a plurality of resonator sections formed on an opposite side of said dielectric substrate, each resonator section being located proximate to a corresponding one of said transmission line segments, including said stub segment, and said resonator sections are complementary resonator sections.

24. A radio-frequency (RF) structure, comprising:
a dielectric substrate;
an impedance transformer formed on one side of said dielectric substrate and comprising a plurality of transmission line segments including at least one transmission line segment configured as a stub segment; and
a plurality of resonator sections formed on an opposite side of said dielectric substrate, each resonator section being located proximate to a corresponding one of said transmission line segments, including said stub segment, and wherein each resonator section comprises a distributed inductor stub portion and a distributed capacitor stub portion, wherein said distributed inductor stub portion and said distributed capacitor stub portion are oriented about parallel to a corresponding transmission line segment.

25. A method of forming a radio-frequency (RF) structure, comprising:
forming a dual branch coupler on one side of a dielectric substrate and having a plurality of transmission line segments configured as an impedance transformer, including at least one transmission line segment configured as a stub segment; and
forming a plurality of resonator sections on an opposite side of said dielectric substrate, each resonator section being located proximate to a corresponding one of said transmission line segments, including said stub segment.

26. A method of forming a radio-frequency (RF) structure, comprising:
forming a transmission line circuit on one side of a dielectric substrate and having a plurality of transmission line segments configured as an impedance transformer, including at least one transmission line segment configured as a stub segment;
forming a plurality of resonator sections on an opposite side of said dielectric substrate, each resonator section being located proximate to a corresponding one of said transmission line segments, including said stub segment, and
forming each of said resonator sections to comprise two nested split rings connected via a line segment, and a middle ring that comprises a distributed inductor stub portion shorted to the line segment and connected in electrical series with a distributed capacitor stub portion.

27. A method of forming a radio-frequency (RF) structure, comprising:
forming a microstrip line circuit on one side of a dielectric substrate and having a plurality of transmission line segments configured as an impedance transformer, including at least one transmission line segment configured as a stub segment; and
forming a plurality of resonator sections as complementary resonator sections on an opposite side of said dielectric substrate, each resonator section being located proximate to a corresponding one of said transmission line segments, including said stub segment.

* * * * *